United States Patent
Markle et al.

(10) Patent No.: US 7,445,945 B1
(45) Date of Patent: Nov. 4, 2008

(54) METHOD AND APPARATUS FOR DYNAMIC ADJUSTMENT OF A SAMPLING PLAN BASED ON WAFER ELECTRICAL TEST DATA

(75) Inventors: Richard J. Markle, Austin, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 184 days.

(21) Appl. No.: 11/194,843

(22) Filed: Aug. 1, 2005

(51) Int. Cl.
*H01L 21/66* (2006.01)
*H01L 21/00* (2006.01)

(52) U.S. Cl. .......................... 438/14; 324/765; 716/19; 702/117; 257/E21.521

(58) Field of Classification Search .................. 438/14; 702/117; 716/19; 324/765; 701/117; 257/E21.521
See application file for complete search history.

(56) References Cited

U.S. PATENT DOCUMENTS

| | | | |
|---|---|---|---|
| 6,124,725 A * | 9/2000 | Sato | 324/765 |
| 2002/0152046 A1 * | 10/2002 | Velichko et al. | 702/117 |
| 2006/0236294 A1 * | 10/2006 | Saidin et al. | 716/19 |
| 2007/0112538 A1 * | 5/2007 | Velichko et al. | 702/117 |

\* cited by examiner

*Primary Examiner*—George Fourson
*Assistant Examiner*—John M Parker
(74) *Attorney, Agent, or Firm*—Williams, Morgan & Amerson

(57) ABSTRACT

The present invention provides a method and apparatus for dynamic adjustment of a sampling plan. The method includes accessing wafer electrical test data associated with at least one workpiece that has been processed by at least one processing tool. The method also includes determining, based on the wafer electrical test data, at least one sampling plan for at least one measurement device configured to measure at least one parameter associated with workpieces processed by the at least one processing tool.

16 Claims, 3 Drawing Sheets

Figure 3A

| IDENTIFICATION | % | ACTIVE? |
|---|---|---|
| TOOL 115(1), SENSOR 125 | 10 | YES |
| TOOL 115(1), DEVICE 135 | 10 | YES |
| ⋮ | | |
| TOOL 115(n), DEVICE 135 | 0 | NO |

Figure 3B

| IDENTIFICATION | % | ACTIVE? |
|---|---|---|
| TOOL 115(1), SENSOR 125 | 10 | YES |
| TOOL 115(1), DEVICE 135 | 100 | YES |
| ⋮ | | |
| TOOL 115(n), DEVICE 135 | 0 | NO |

Figure 3C

| IDENTIFICATION | % | ACTIVE? |
|---|---|---|
| TOOL 115(1), SENSOR 125 | 10 | YES |
| TOOL 115(1), DEVICE 135 | 10 | YES |
| ⋮ | | |
| TOOL 115(n), DEVICE 135 | 10 | YES |

METHOD AND APPARATUS FOR DYNAMIC ADJUSTMENT OF A SAMPLING PLAN BASED ON WAFER ELECTRICAL TEST DATA

BACKGROUND OF THE INVENTION

1. Field of the Invention

This invention relates generally to the field of semiconductor device manufacturing and, more particularly, to a method and apparatus for dynamic adjustment of a sampling plan based on wafer electrical test data.

2. Description of the Related Art

A variety of processing tools are used to fabricate a semiconductor device. The processing tools may include photolithography steppers, etch tools, deposition tools, polishing tools, rapid thermal processing tools, ion implantation tools, and the like. Wafers and/or wafer lots, collectively referred to hereinafter as workpieces, are processed in the tools in a predetermined order and each processing tool modifies the workpieces according to a particular operating recipe. For example, a photolithography stepper may be used to form a patterned layer of photoresist (i.e. a mask) above a layer of gate electrode material that has been deposited above a wafer. Features in the patterned layer of photoresist correspond to a plurality of features, e.g. gate electrode structures, which will ultimately be formed above the surface of the wafer in the layer of gate electrode material.

The performance of individual processing tools is typically monitored using one or more sensors to collect data associated with operation of the processing tool. For example, an etching tool may include a sensor to monitor the radio frequency power delivered by the etching tool. For another example, a rapid thermal anneal tool may include a thermocouple to monitor a temperature within the tool. The data acquired by the various sensors may be referred to as tool trace data. The collected tool trace data may be used for various purposes such as fault detection and/or classification. For example, the tool trace data collected by the thermocouple in the rapid thermal anneal tool may indicate that the temperature within the tool has dropped below a desired threshold, indicating a possible fault.

The performance of individual processing tools may also be monitored using one or more integrated metrology tools to collect wafer state data indicative of the physical state of one or more wafers processed in the processing tool. For example, one or more integrated metrology tools may be used to perform measurements on selected wafers after they have been processed by one or more processing tools. The integrated metrology tools may include scatterometers, ellipsometers, temperature sensors, and the like. The measurements may include measurements of a temperature of a wafer, a thickness of a layer of material formed on the wafer, a critical dimension (CD) of one or more features formed on the wafer, a profile of one or more features formed on the wafer, and the like. The measurements may be performed in situ or ex situ, depending on the type of integrated metrology tool.

Wafer electrical tests are also performed on wafers to collect data related to anticipated yield and/or electrical performance of the devices formed on the wafers. The wafer electrical tests typically test logical and/or electrical properties of the devices. Some wafer electrical tests operate on a device level. For example, one wafer electrical test may test the switching speed of individual transistors on a die, an electrical path on the die, a word line in a memory device, and the like. Wafer electrical tests also test integrated circuits on an operational level. For example, a wafer electrical test may be used to assess the processing speed and/or accuracy of logical operations performed by a microprocessor. For another example, a wafer electrical test may be used to assess the read/write speed and/or stability of a flash memory device.

Faults in the processing tools may degrade the performance of the devices formed on wafers processed by the faulty processing tools, and in some cases may lead to device failures that force the finished products to be reworked or discarded. Some faults may be detected using the sensors or integrated metrology tools, which may permit the fault to be corrected or compensated for in subsequent processing. However, other faults are not detected until the finished product undergoes wafer electrical testing. Although the wafer electrical test data may include information indicative of the faults that may be used to correct or compensate for the fault, these tests are typically performed weeks or months after the devices are formed on the workpieces. Consequently, wafer electrical test data can not easily be used to detect and/or correct faulty processing.

The present invention is directed to addressing the effects of one or more of the problems set forth above.

SUMMARY OF THE INVENTION

In one embodiment of the present invention, a method is provided for dynamic adjustment of a sampling plan. The method includes accessing wafer electrical test data associated with at least one workpiece that has been processed by at least one processing tool. The method also includes determining, based on the wafer electrical test data, at least one sampling plan for at least one measurement device configured to measure at least one parameter associated with workpieces processed by the at least one processing tool. In other embodiments, apparatuses for implementing the method are provided.

BRIEF DESCRIPTION OF THE DRAWINGS

The invention may be understood by reference to the following description taken in conjunction with the accompanying drawings, in which like reference numerals identify like elements, and in which:

FIG. 3A conceptually illustrates an exemplary embodiment of a sampling plan, in accordance with the present invention;

FIG. 3B conceptually illustrates a first exemplary embodiment of a modified sampling plan, in accordance with the present invention; and FIG. 3C conceptually illustrates a second exemplary embodiment of a modified sampling plan, in accordance with the present invention.

Figure 1:
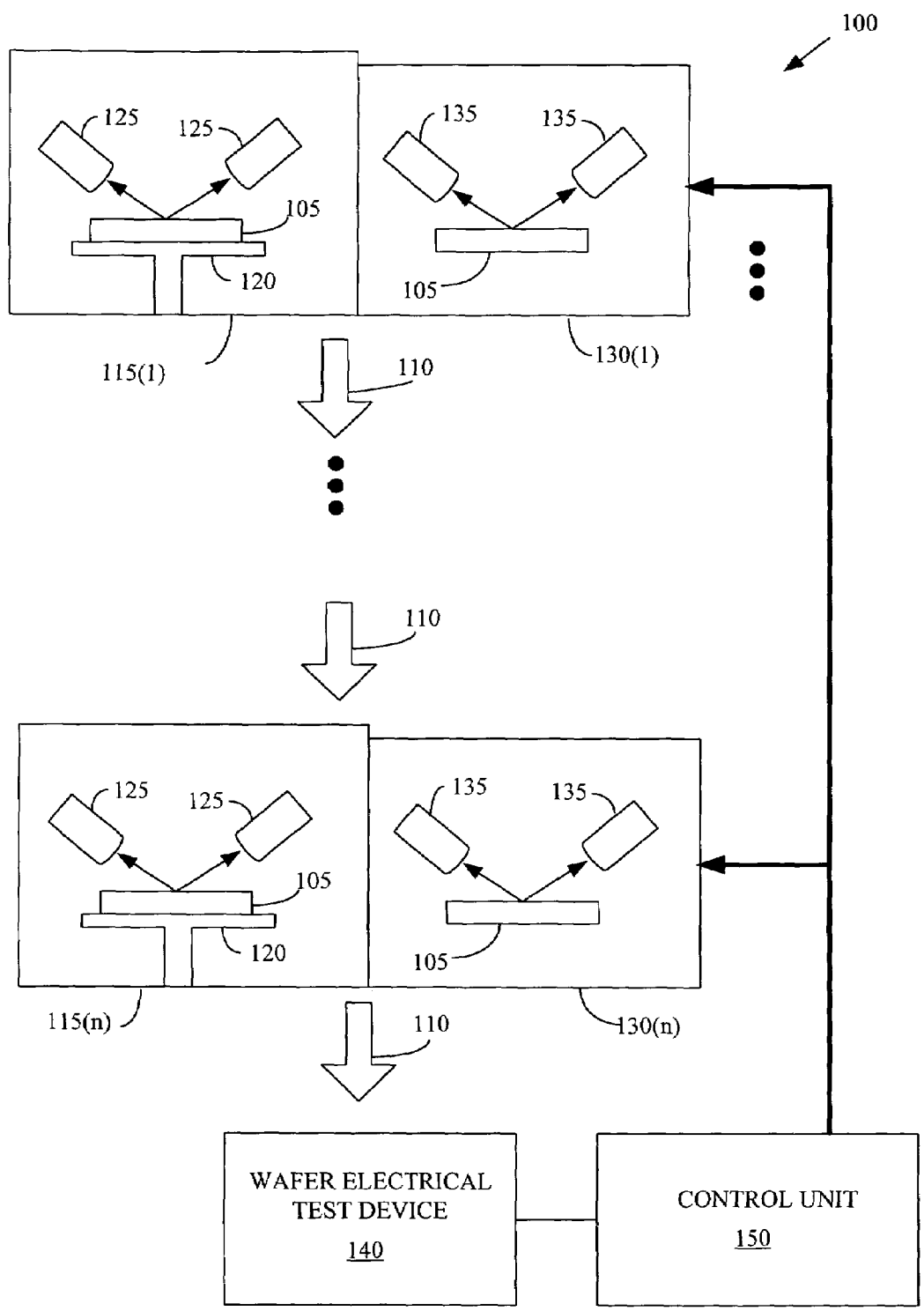
FIG. 1 shows a simplified block diagram of a portion of an illustrative manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Some portions of the detailed descriptions herein are presented in terms of a software implemented process involving symbolic representations of operations on data bits within a memory in a computing system or a computing device. These descriptions and representations are the means used by those in the art to most effectively convey the substance of their work to others skilled in the art. The process and operation require physical manipulations of physical quantities. Usually, though not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantifies. Unless specifically stated or otherwise as may be apparent, throughout the present disclosure, these descriptions refer to the action and processes of an electronic device, that manipulates and transforms data represented as physical (electronic, magnetic, or optical) quantities within some electronic device's storage into other data similarly represented as physical quantities within the storage, or in transmission or display devices. Exemplary of the terms denoting such a description are, without limitation, the terms "processing," "computing," "calculating," "determining," "displaying," and the like.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 shows a simplified block diagram of a portion of an illustrative manufacturing system 100. In the illustrated embodiment, the manufacturing system 100 is adapted to fabricate semiconductor devices. Although the invention is described as it may be implemented in a semiconductor fabrication facility, the invention is not so limited and may be applied to other manufacturing environments. The techniques described herein may be applied to a variety of workpieces 105 or manufactured items, including, but not limited to, microprocessors, memory devices, digital signal processors, application specific integrated circuits (ASICs), or other similar devices. The techniques may also be applied to workpieces or manufactured items other than semiconductor devices. In various alternative embodiments, the workpieces 105 may include one or more wafers or wafer lots.

An exemplary information exchange and process control framework suitable for use in the manufacturing system 100 is an Advanced Process Control (APC) framework, such as may be implemented using the Catalyst system formerly offered by KLA-Tencor, Inc. The Catalyst system uses Semiconductor Equipment and Materials. International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif. However, persons of ordinary skill in the art should appreciate that the present invention is not limited to the Catalyst APC system. In alternative embodiments, any desirable information exchange and process control framework may be used without departing from the scope of the present invention.

The manufacturing system 100 includes a process flow indicated by the arrows 110. The process flow 110 shown in FIG. 1 includes a plurality of processing tools 115(1-n) for processing the workpiece 105. For example, the process flow 110 may include a deposition tool for depositing a layer of material above a portion of the workpiece 105, a photolithography stepper for forming a masking layer above the deposited layer, an etching tool for etching the deposited layer, and a chemical mechanical polishing tool to polishing the etched layer. However, persons of ordinary skill in the art should appreciate that any desirable number of processing tools 115 (1-n) may be used in the process flow 110. For example, the process flow 110 may include a single processing tool 115. Moreover, the workpiece 105 may be provided to the processing tools 115(1-n) in any desirable order.

In the illustrated embodiment, the processing tools 115(1-n) include a platform or wafer stage 120 and the workpiece 105 is disposed upon the platform or wafer stage 120 while the workpiece 105 is being processed in the processing tool 115(1-n). Persons of ordinary skill in the art should appreciate that the processing tools 115(1-n) may include other components not shown in FIG. 1. For example, the processing tools 115(1-n) may include various power connections and/or valves to control the flow of various process gases. In the interest of clarity, only those components of the processing tools 115(1-*n*) that are relevant to the present invention will be discussed herein.

Figure 2:
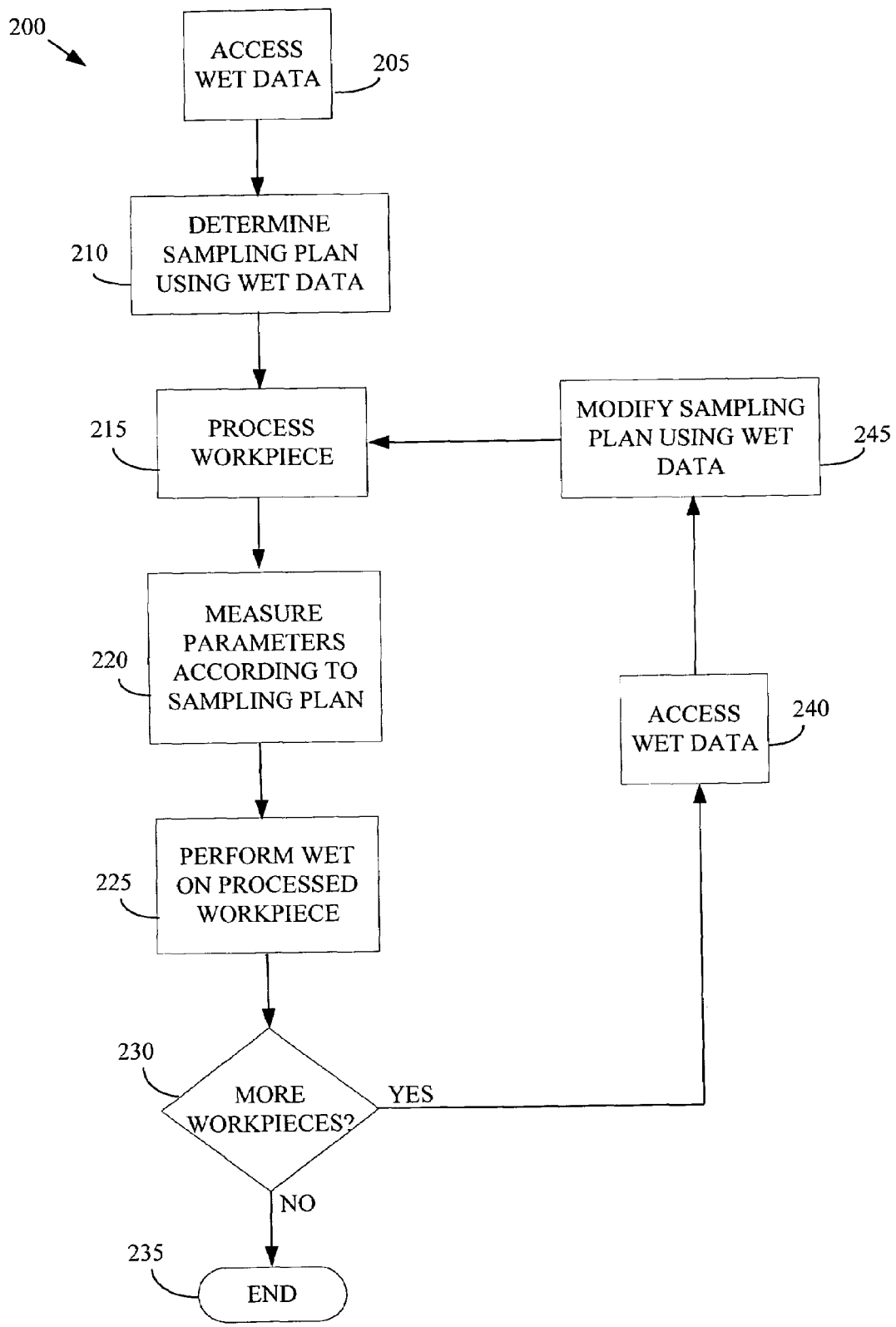
FIG. 2 conceptually illustrates one exemplary embodiment of a method of determining a sampling plan using wafer electrical test data, in accordance with the present invention.

The processing tools 115(1-*n*) may include one or more wafer measurement devices 125. In one embodiment, the wafer measurement devices 125 are sensors for collecting in situ wafer state data. However, the present invention is not limited to any particular type of wafer measurement devices 125. In various alternative embodiments, the wafer measurement devices 125 may be any desirable type of device, or any desirable combination of types of devices, for collecting wafer state data. For example, the wafer measurement devices 125 may include scatterometers, ellipsometers, in situ metrology tools, and the like that are deployed in one or more of the processing tools 115(1-*n*). Moreover, the present invention is not limited to any particular number of wafer measurement devices 125. In alternative embodiments, the processing tools 115(1-*n*) may include more or fewer wafer measurement devices 125 than are shown in FIG. 2.

The manufacturing system 100 may also include at least one wafer metrology tool 130(1-*n*). In the illustrated embodiment, the wafer metrology tool 130(1-*n*) is an integrated metrology tool that is physically coupled to one or more of the processing tools 115(1-*n*). However, in alternative embodiments, the wafer metrology tool 130(1-*n*) may be any desirable type of wafer metrology tool, including a stand-alone wafer metrology tool (not shown). In the illustrated embodiment, each of the one or more of the processing tools 115(1-*n*) is associated with one wafer metrology tool 130(1-*n*). However, the present invention is not limited to embodiments that include a single wafer metrology tool 130(1-*n*) for each of the one or more of the processing tools 115(1-*n*). In alternative embodiments, some processing tools 115(1-*n*) may not have an associated wafer metrology tool 130(1-*n*). In other alternative embodiments, some processing tools 115(1-*n*) may have more than one associated wafer metrology tool 130(1-*n*) or more that one processing tool 115(1-*n*) may be associated with each wafer metrology tool 130(1-*n*).

The wafer metrology tool 130(1-*n*) includes one or more wafer measurement devices 135 for collecting wafer state data associated with the workpiece 105, such as ex situ wafer state data. The wafer measurement devices 135 may include scatterometers, ellipsometers, ex situ metrology tools, and the like, which may be used to collect wafer state data including critical dimensions of one or more features formed on the workpiece 105, profiles of one or more features formed on the workpiece 105, thicknesses of one or more layers formed on the workpieces 105, and the like. Persons of ordinary skill in the art should appreciate that the present invention is not limited to any particular number of wafer measurement devices 135. In alternative embodiments, the wafer metrology tools 130(1-*n*) may include more or fewer wafer measurement devices 135 than are shown in FIG. 1.

In operation, the workpiece 105 may be provided to the processing tools 115(1-*n*) and the wafer measurement tool 130 in any desirable order. In one embodiment, the workpiece 105 is transferred from the processing tools 115(1-*n*) to the wafer measurement tool 130 substantially after processing in the associated processing tool 115(1-*n*) is complete. However, the present invention is not limited to transferring the workpiece 105 to the wafer measurement tool 130 after processing in the associated processing tool 115(1-*n*) is complete. In one alternative embodiment, the workpiece 105 is transferred from the associated processing tool 115(1) to the wafer metrology tool 130(1-*n*) between successive processing steps carried out by the same processing tool 115(1). In another alternative embodiment, the workpiece 105 may be provided to the wafer metrology tool 130(1-*n*) substantially before undergoing processing in the associated processing tool 115(1-*n*).

The workpiece 105 is provided to a wafer electrical test device 140 substantially after being processed in the process flow 110. The wafer electrical test device 140 may perform one or more of a variety of electrical tests on the processed workpiece 105. In various alternative embodiments, the wafer electrical test device 140 may be of any type or configuration, e.g. a stand-alone tool, a four-point probe, and the like. Although some specific examples of electrical tests that may be performed on the workpiece 105 will be discussed herein to illustrate various aspects of the present invention, persons of ordinary skill in the art should appreciate that these examples are intended to be exemplary and are not intended to limit the scope of the present invention.

Wafer electrical test data collected by the wafer electrical test the device 140 may be associated and/or correlated with some or all of the wafer state data that may be collected by the wafer measurement devices 125 and/or the wafer measurement devices 135. For example, electrical measurements of a tunnel oxide layer may be indicative of a fault related to the tunnel oxide layer. The electrical measurements of the tunnel oxide layer may then be associated with measurements of a tunnel oxide thickness performed by the wafer measurement devices 125, 135. Together, the wafer electrical test data and the measurements of the tunnel oxide thickness may provide increased visibility that may be used to characterize and/or correct the fault.

For another example, a wafer electrical test of a ring oscillator frequency of a microprocessor may be correlated and/or associated with a measurement of one or more gate lengths, one or more critical dimensions of one or more features, a thickness of a gate insulation layer, measurements related to a rapid thermal annealing process, and the like. For yet another example, a relationship analysis of a portion of the wafer electrical test data may indicate that a fault is associated with a group of workpieces 105 that have been processed by a particular processing tool 115(1-*n*) and/or process flow 110. Thus, the fault revealed by the relationship analysis may also be indicated in a portion of the wafer state data collected by wafer measurement devices 125, 135 associated with the processing tool 115(1-*n*) and/or the process flow 110.

A control unit 150 accesses at least a portion of the wafer electrical test data collected by the wafer electrical test device 140. In one embodiment, the wafer electrical test device 140 provides a portion of the wafer electrical test data to the control unit 150. However, the present invention is not limited to a wafer electrical test device 140 that provides a portion of the wafer electrical test data to the control unit 150. In alternative embodiments, the control unit 150 may access to the wafer electrical test data from any desirable location, including a memory (not shown). As will be discussed in detail below, the control unit 150 determines at least one sampling plan for one or more of the wafer measurement devices 125, 135 that is used to measure one or more parameters associated with the workpiece 105.

FIG. 2 conceptually illustrates one exemplary embodiment of a method 200 of determining a sampling plan using wafer electrical test data. In the illustrated embodiment, wafer electrical test data is accessed (at 205). In one embodiment, wafer electrical test data associated with workpieces that have been processed in the current run is accessed (at 205). However, the present invention is not limited to accessing (at 205) wafer electrical test data associated with workpieces that have been processed in the current run. In one alternative embodiment, wafer electrical test data associated with workpieces that have been processed in previous runs may be accessed (at 205). For example, historical wafer electrical test data may be accessed (at 205), e.g. from a database of historical wafer electrical test data. A sampling plan is then determined (at 210) using the wafer electrical test data. For example, the controller 150 shown in FIG. 1 may determine (at 210) the sampling plan based on wafer electrical test data associated with a tunnel oxide layer of a memory device. If the wafer electrical test data is indicative of a fault related to a thickness of the tunnel oxide layer, such as an electrical short or a resistance that is outside an allowable range, the sampling plan may indicate that the wafer metrology tool 125, 135 should measure a tunnel oxide thickness associated with each workpiece.

FIG. 3A conceptually illustrates an exemplary embodiment of a sampling plan 300, such as may be determined (at 210) by the method 200 shown in FIG. 2. Although the illustrated embodiment shows a single sampling plan 300 for all of the wafer measurement devices 125, 135, persons of ordinary skill in the art should appreciate that the present invention is not limited to a single sampling plan 300. In alternative embodiments, a plurality of sampling plans associated with one or more of the wafer measurement devices 125, 135 and/or one or more of the processing tools 115(1-n) may be determined (at 210). In various alternative embodiments, these sampling plans may be combined to form the sampling plan 300, they may be provided separately to the appropriate processing tool, or they may be grouped into a plurality of combination sampling plans that may be provided to one or more processing tools.

The sampling plan 300 includes an identification field 305, a sampling percentage field 310, and an active field 315. The identification field 305 contains information indicative of one or more of the measurement devices 125, 135. In the illustrated embodiment, the information in the identification field 305 includes the indices used indicate the various processing and/or measurement tools, sensors, and devices illustrated in FIG. 1. However, persons of ordinary skill in the art should appreciate that any desirable information may be used to indicate the one or more measurement devices 125, 135. For example, a name, a model number, a brief description, and the like may be included in the identification field 305.

The sampling percentage field 310 indicates the percentage of workpieces processed in the associated processing tool 115(1-n) that may be measured by the associated wafer measurement device 125, 135 and the active field 315 indicates whether or not the associated wafer measurement device 125, 135 is actively measuring one or more parameters associated with the workpiece 105. In the illustrated embodiment, the sensor 125 in the processing tool 115(1) is actively measuring one or more parameters associated with 10% of the workpieces 105, as indicated by the string "YES" in the active field 315 in the number "10" in the sample percentage field 310. The device 135 in the processing tool 115(1) is also actively measuring one or more parameters associated with 10% of the workpieces 105, as indicated by the string "YES" in the active field 315 in the number "10" in the sample percentage field 310. The device 135 in the processing tool 115(n) is not actively measuring parameters, as indicated by the string "NO" in the active field 315 in the number "0" in the sample percentage field 310.

In various alternative embodiments, the sampling plan 300 may include additional information indicative of measurements of one or more parameters associated with the workpiece 105 that may be carried out by one or more of the wafer measurement devices 125, 135. For example, the sampling plan 300 may include a parameter list associated with one or more of the wafer measurement devices 125, 135. The parameter list may include a list of parameters that are to be measured by the associated wafer measurement device 125, 135. The listed parameters may include a layer thickness, a critical dimension, a profile, a wavelength, a defect density, an optical property, a layer resistivity, a location on a workpiece, or any other desirable parameter. For another example, the sampling plan 300 may include information indicative of a sampling area, a sampling rate, a sampling resolution, a sampling granularity, and the like. Persons of ordinary skill in the art should appreciate that the above list of possible embodiments is not exhaustive and is not intended to limit the present invention.

Referring back to FIG. 2, the workpiece 105 is processed (at 215) and one or more parameters associated with the workpiece 105 are measured (at 220). For example, one or more gate insulation layers may be formed on the workpiece 105 when it is processed (at 215) and one or more thicknesses of the gate insulation layers may be measured (at 220), as indicated by the sampling plan. One or more wafer electrical tests are then performed (at 225) on the processed workpiece 105. If it is determined (at 230) that there are no additional workpieces 105 to be processed in the process flow, the method 200 and (at 235).

If it is determined (at 230) that one or more additional workpieces 105 remain to be processed in the process flow, wafer electrical test data is accessed (at 240). In one embodiment, the wafer electrical test data that is accessed (at 240) includes wafer electrical test data collected from the most recently processed workpieces 105. However, the present invention is not limited to using wafer electrical test data collected from the most recently processed workpieces 105. In alternative embodiments, previously collected wafer electrical test data, which may include historical wafer electrical test data, may be accessed (at 240).

The sampling plan may then be modified (at 240) based on the wafer electrical test data. In one embodiment, the sampling plan is modified (at 240) in response to determining that one or more faults occurred during processing (at 215) of the workpiece, as indicated by the wafer electrical test data. For example, a reflectometry sensor may sample a center region of the workpiece. However, if the wafer electrical test data indicates that a fault occurred in an edge region of the workpiece, the sampling plan may be modified (at 240) so that the reflectometry sensor samples the edge region of the workpiece. For another example, a number or range of wavelengths sampled during optical emission metrology may be modified (at 240) to sample a different gas chemistry in response to determining that one or more faults occurred.

FIG. 3B conceptually illustrates a first exemplary embodiment of a modified sampling plan 320. In the illustrated embodiment, the sampling plan 300 shown in FIG. 3A has been modified (at 240) to form the modified sampling plan 320. During processing according to the modified sampling plan 320, the device 135 in the processing tool 115(1) should actively measure one or more parameters associated with 100% of the workpieces 105, as indicated by the string "YES" in the modified active field 330 in the number "100" in the modified sample percentage field 325. The increased sampling percentage may provide additional information as to one or more potential causes of one or more faults, such as the faults that are indicated by the wafer electrical test data.

FIG. 3C conceptually illustrates a second exemplary embodiment of a modified sampling plan 340. In the illustrated embodiment, the sampling plan 300 shown in FIG. 3A has been modified (at 240) to form the modified sampling plan 340. During processing according to the modified sampling plan 340, the device 135 in the processing tool 115(n) should actively measure one or more parameters associated with 10% of the workpieces 105, as indicated by the string "YES" in the modified active field 350 in the number "10" in the modified sample percentage field 345. Adding the addition device 135 to the active list may provide additional information as to one or more causes of one or more faults, such as the faults that are indicated by the wafer electrical test data.

As discussed above, the sampling plan 300 may include information indicative of other measurements that may be carried out by one or more of the wafer measurement devices 125, 135. Accordingly, in various alternative embodiments, the sampling plan 300 may be modified to add, change, or remove this information to indicate modifications to these measurements. For example, one or more parameters, such as a layer thickness, a critical dimension, a profile, a wavelength, a location on a workpiece, or any other desirable parameter, may be added to or removed from a parameter list included in the sampling plan 300. For another example, a sampling area, a sampling rate, a sampling resolution, a sampling granularity, and the like may be increased or decreased, as indicated by modified information in the sampling plan 300.

Referring back to FIG. 2, the additional workpiece is processed (at 215) and the parameters associated with the workpiece are measured (at 220), as indicated by the modified sampling plan. The method 200 then proceeds as discussed above until it is determined (at 230) that no more workpieces remain to be processed in the current run. The method ends (at 235).

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    accessing wafer electrical test data associated with at least one workpiece that has been processed by at least one processing tool, the wafer electrical test data having been acquired by testing said at least one workpiece using a wafer electrical test device; and
    determining, based on the wafer electrical test data, at least one sampling plan for at least one measurement device other than the wafer electrical test device, said at least one measurement device being configured to measure at least one parameter associated with workpieces processed by the at least one processing tool.

2. The method of claim 1, wherein accessing the wafer electrical test data comprises accessing the wafer electrical test data from a memory.

3. The method of claim 1, wherein accessing the wafer electrical test data comprises accessing wafer electrical test data associated with at least one workpiece that has been processed by a plurality of processing tools in a process flow.

4. The method of claim 1, wherein determining the at least one sampling plan for the at least one measurement device comprises determining a parameter list indicative of the at least one parameter to be measured.

5. The method of claim 4, wherein determining the parameter list indicative of the at least one parameter to be measured comprises determining a parameter list including at least one of a layer thickness, a critical dimension, a profile, a wavelength, a defect density, an optical property, a layer resistivity, and a location on a workpiece.

6. The method of claim 4, wherein determining the parameter list indicative of the at least one parameter to be measured comprises modifying a previously determined parameter list.

7. The method of claim 1, wherein determining the at least one sampling plan for the at least one measurement device comprises determining at least one sampling plan for at least one of a sensor, an integrated metrology tool, and a stand-alone metrology tool.

8. The method of claim 1, further comprising measuring at least one parameter associated with the workpiece according to the sampling plan.

9. A method, comprising:
    accessing wafer electrical test data associated with at least one workpiece that has been processed by at least one processing tool; and
    determining, based on the wafer electrical test data, at least one sampling plan for at least one measurement device configured to measure at least one parameter associated with workpieces processed by the at least one processing tool wherein determining the at least one sampling plan comprises modifying at least one previously determined sampling plan.

10. The method of claim 9, wherein determining the at least one sampling plan based on the wafer electrical test data comprises detecting a wafer electrical test failure.

11. The method of claim 10, wherein modifying the at least one sampling plan comprises modifying the at least one sampling plan in response to detecting the wafer electrical test failure.

12. The method of claim 9, wherein modifying the at least one sampling plan comprises at least one of adding a new measurement device to an active measurement device list and removing a measurement device from an active measurement device list.

13. A method, comprising:
    accessing wafer electrical test data associated with at least one workpiece that has been processed by at least one processing tool; and
    determining, based on the wafer electrical test data, at least one sampling plan for at least one measurement device configured to measure at least one parameter associated with workpieces processed by the at least one processing tool wherein determining the at least one sampling plan comprises modifying at least one previously determined sampling plan, and wherein modifying the at least one sampling plan comprises increasing at least one of a sampling rate, a sampling percentage, a sampling resolution, a sampling area, and a sampling granularity.

14. A method, comprising:
    accessing wafer electrical test data associated with at least one workpiece that has been processed by at least one processing tool; and
    determining, based on the wafer electrical test data, at least one sampling plan for at least one measurement device configured to measure at least one parameter associated with workpieces processed by the at least one processing tool wherein determining the at least one sampling plan comprises modifying at least one previously determined sampling plan, and wherein modifying the at least one sampling plan comprises decreasing at least one of a sampling rate, a sampling percentage, a sampling resolution, a sampling area, and a sampling granularity.

15. The method of claim 9, further comprising processing at least one workpiece substantially after modifying the sampling plan.

16. The method of claim 15, further comprising measuring, according to the modified sampling plan, at least one parameter associated with the at least one workpiece that was processed substantially after modifying the sampling plan.

* * * * *